United States Patent
Hoang et al.

(10) Patent No.: US 10,334,732 B2
(45) Date of Patent: Jun. 25, 2019

(54) AREA-EFFICIENT CONNECTIONS TO SIP MODULES

(71) Applicant: Apple Inc., Cupertino, CA (US)

(72) Inventors: Lan H. Hoang, San Jose, CA (US); Takayoshi Katahira, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/713,453

(22) Filed: Sep. 22, 2017

(65) Prior Publication Data

US 2019/0098762 A1    Mar. 28, 2019

(51) Int. Cl.
| | |
|---|---|
| H05K 5/00 | (2006.01) |
| H05K 7/00 | (2006.01) |
| H05K 1/18 | (2006.01) |
| H05K 7/14 | (2006.01) |
| H05K 1/11 | (2006.01) |
| H05K 1/14 | (2006.01) |

(52) U.S. Cl.
CPC .......... *H05K 1/182* (2013.01); *H05K 1/112* (2013.01); *H05K 1/118* (2013.01); *H05K 1/14* (2013.01); *H05K 1/189* (2013.01); *H05K 7/1422* (2013.01)

(58) Field of Classification Search
CPC ........................................ H05K 1/14
USPC .......................................... 361/784
See application file for complete search history.

(56) References Cited

U.S. PATENT DOCUMENTS

| | | | |
|---|---|---|---|
| 5,274,570 A * | 12/1993 | Izumi et al. | ........ B60R 16/0239 361/679.32 |
| 8,294,252 B1 | 10/2012 | Patel | |
| 2003/0165051 A1 | 9/2003 | Kledzik et al. | |
| 2006/0115928 A1 | 6/2006 | Nguyen et al. | |
| 2006/0163707 A1 | 7/2006 | Hooi | |
| 2007/0057357 A1 | 3/2007 | Chen | |
| 2008/0167094 A1* | 10/2008 | Dinh et al. | ........ H04M 1/0274 455/575.3 |
| 2008/0246008 A1 | 10/2008 | Kuroda | |
| 2009/0000114 A1 | 1/2009 | Rao | |
| 2010/0140759 A1 | 6/2010 | Pagaila | |
| 2010/0290191 A1 | 11/2010 | Lin | |
| 2010/0331738 A1* | 12/2010 | Stein et al. | ............ A61B 5/103 600/587 |
| 2011/0286194 A1 | 11/2011 | Kawabata | |
| 2012/0061814 A1 | 3/2012 | Camacho et al. | |
| 2012/0217624 A1 | 8/2012 | Morris et al. | |
| 2013/0223038 A1 | 8/2013 | Yamamoto et al. | |
| 2013/0241044 A1 | 9/2013 | Kim | |

(Continued)

FOREIGN PATENT DOCUMENTS

| | | |
|---|---|---|
| CN | 103517577 A | 1/2014 |
| CN | 103579114 A | 2/2014 |

(Continued)

OTHER PUBLICATIONS

Office Action dated Apr. 30, 2018 in U.S. Appl. No. 15/080,523, 13 pages.

(Continued)

*Primary Examiner* — Binh B Tran
(74) *Attorney, Agent, or Firm* — Kilpatrick Townsend & Stockton, LLP

(57) ABSTRACT

Connectors that allow system-in-package modules to connect to other circuits in an electronic device in an area-efficient manner.

20 Claims, 14 Drawing Sheets

(56) References Cited

U.S. PATENT DOCUMENTS

| | | |
|---|---|---|
| 2013/0343023 A1 | 12/2013 | Nakagoshi et al. |
| 2014/0103527 A1 | 4/2014 | Marimuthu et al. |
| 2014/0167232 A1 | 6/2014 | LoBianco |
| 2014/0203457 A1 | 7/2014 | Kim et al. |
| 2015/0187742 A1 | 7/2015 | Kwon et al. |
| 2015/0200182 A1 | 7/2015 | Wang et al. |
| 2015/0200185 A1 | 7/2015 | Yu et al. |
| 2015/0206854 A1 | 7/2015 | Lane et al. |
| 2015/0348865 A1 | 12/2015 | Vincent |
| 2015/0359099 A1 | 12/2015 | Pennathur et al. |

FOREIGN PATENT DOCUMENTS

| | | |
|---|---|---|
| JP | 2011514015 | 4/2011 |
| KR | 1020090022749 | 3/2009 |
| WO | 2013/095402 A1 | 6/2013 |
| WO | 2013/176426 A1 | 11/2013 |

OTHER PUBLICATIONS

Office Action dated May 11, 2018 in U.S. Appl. No. 15/713,705, 13 pages.
Notice of Allowance dated Dec. 17, 2018 in U.S. Appl. No. 15/713,705, 9 pages.
Utility Model Patent Evaluation Report dated Dec. 20, 2018 in Chinese Patent No. ZL2016900002705, 6 pages.

\* cited by examiner

AREA-EFFICIENT CONNECTIONS TO SIP MODULES

BACKGROUND

The number of types of electronic devices that are commercially available has increased tremendously the past few years and the rate of introduction of new devices shows no signs of abating. Devices, such as tablet, laptop, netbook, desktop, and all-in-one computers, cell, smart, and media phones, storage devices, portable media players, navigation systems, monitors, and others, have become ubiquitous.

The functionality of these devices has likewise greatly increased. This in turn has led to increased complexity inside of these electronic devices. At the same time, the dimensions of these devices have become smaller. For example, smaller and thinner devices are becoming more popular.

This increasing functionality and decreasing size have necessitated the use of space-efficient circuit manufacturing techniques. As one example, system-in-package (SIP) modules and other similar structures may be used to increase an electronic device's functionality while reducing space consumed in the device. Reducing the space consumed in a device allows additional functionality to be included in the device, allows the device to be smaller, or a combination thereof.

These system-in-package modules may include electronic devices or components placed on a board and then sealed and encapsulated in a plastic or other material. The system-in-package modules may then be put in an electronic device along with other components and circuits. But it may be difficult for a system-in-package module to communicate with these other circuits in the electronic device. Also, interconnect structures used by the system-in-package module to communicate with the other circuits should be small to avoid losing the benefit of a reduced size that may be gained by using a system-in-package module.

Thus, what is needed are connectors that allow system-in-package modules to connect to other circuits in an electronic device in an area-efficient manner.

SUMMARY

Accordingly, embodiments of the present invention may provide connectors that allow system-in-package modules to connect to other circuits in an electronic device in an area-efficient manner.

System-in-package modules may provide an efficient structure for packing a large amount of functionality into a small space. But it may be difficult to connect components in a system-in-package module to other circuits or modules in an electronic device. Accordingly, embodiments of the present invention may provide connectors and other structures for forming pathways for signal and power between system-in-package modules and other circuitry in an electronic device. An illustrative embodiment of the present invention may provide a system-in-package module having a two printed circuit boards with an intervening frame. A flexible circuit board may attach to the frame, a printed circuit board, or both. The flexible circuit board may have contacts on a surface. The surface contacts may electrically connect or be attached to contacts on the frame. The frame may be an LDS frame and the contacts may be plated contacts on the LDS frame. In these and other embodiments of the present invention, one or more pins or other conductive structures may be attached to the flexible circuit board. These pins may electrically connect to contacts on the frame, a printed circuit board, or both.

These and other embodiments of the present invention may provide a system-in-package module having an intermediate flexible circuit board between two facing printed circuit boards. The intermediate flexible circuit board may pass through an opening in a frame or between portions of a frame. The intermediate flexible circuit board may connect to contacts on a frame. Other vertical interconnect may be used to connect either or both of the facing printed circuit boards of the system-in-package module to the flexible circuit board.

These and other embodiments of the present invention may provide frames and other portions for system-in-package modules that are formed of LDS materials. These LDS materials may be at least somewhat pliable and flexible. Accordingly, these and other embodiments of the present invention may provide LDS frames and other portions that may be, or may include, board-to-board connectors.

These and other embodiments of the present invention may provide connectors and other connecting structures for frames and other portions of system-in-package modules. Frames, housing portions, and other structures in these system-in-package modules may include or be formed around one or more contacts. These contacts may electrically connect to portions of flexible circuit boards, to contacts or pins attached to flexible circuit boards, or to other contact structures. In this way, a frame for a system-in-package module may act as a housing for a connector or other contacting structure.

It should be noted that while the interconnect structures described here are well-suited for system-in-package modules, in other embodiments of the present invention, other types of electronic devices may be formed using these techniques. Embodiments of the present invention may be used at different levels in the manufacturing of a SIP module. For example, a SIP module may be formed of one or more other sub-modules, and these embodiments of the present invention may be used in one or more of these sub-modules. The SIP module itself may be formed by employing one or more embodiments of the present invention.

In various embodiments of the present invention, contacts, interconnect paths, and other conductive portions of SIP modules may be formed by stamping, metal-injection molding, machining, micro-machining, ink jet, 3-D printing, aerosol-jet printing, or other type of printing or manufacturing process. The conductive portions may be formed of stainless steel, steel, copper, copper titanium, aluminum, phosphor bronze, or other material or combination of materials. They may be plated or coated with nickel, gold, or other material. The nonconductive portions may be formed using injection or other molding, ink-jet, 3-D, aerosol-jet, or other type of printing, machining, or other manufacturing process. The nonconductive portions may be formed of silicon or silicone, rubber, hard rubber, plastic, nylon, liquid-crystal polymers (LCPs), plastic, epoxy, resin, or other nonconductive material or combination of materials. The printed circuit board or other appropriate substrates used may be formed of FR-4, BT or other material. Printed circuit boards may be replaced by other substrates, such as flexible circuit boards, in many embodiments of the present invention, while flexible circuit boards may be replaced by printed circuit boards in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY EMBODIMENTS

System-in-package modules may provide an efficient structure for packing a large amount of functionality into a small space. But it may be difficult to connect components in a system-in-package module to other circuits or modules in an electronic device. Accordingly, embodiments of the present invention may provide connectors and other structures for forming pathways for signal and power between system-in-package modules and other circuitry in an electronic device. Examples are shown in the following figures.

Figure 1:
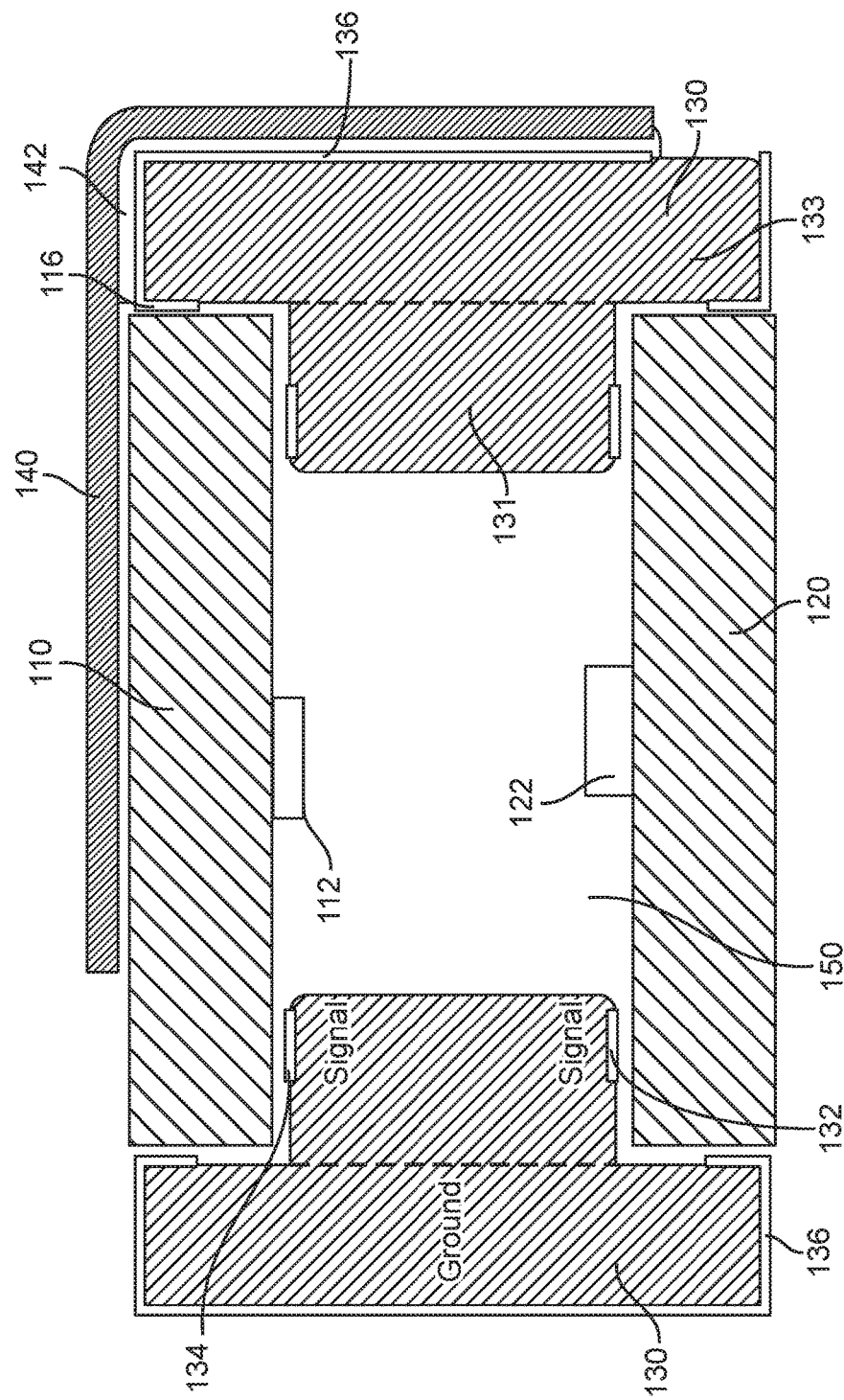
FIG. 1 illustrates a system-in-package module according to an embodiment of the present invention.

FIG. 1 illustrates a system-in-package module according to an embodiment of the present invention. This example may include a top printed circuit board 110 facing a bottom printed circuit board 120. Component 112 may be located on a surface of top printed circuit board 110. Component 122 may be located on a surface of bottom printed circuit board 120, where the surfaces of the top printed circuit board 110 and bottom printed circuit board 120 may face each other and components 112 and 122 may be between them. Frame 130 may be located at least partially between top printed circuit board 110 and bottom printed circuit board 120. Frame 130 may follow an outside edge of either top printed circuit board 110 or bottom printed circuit board 120. For example, top printed circuit board 110 and bottom printed circuit board 120 may overlap in an area, and frame 130 may follow or be located at least partially along an edge of this overlap area. In these and other embodiments of the present invention, other portions of frame 130 may cut across surfaces of either or both top printed circuit board 110 and bottom printed circuit board 120. This may be particularly useful for isolating different sections of a system-in-package module from each other.

Frame 130 may be partially between top printed circuit board 110 and bottom printed circuit board 120 and partially outside along edges of top printed circuit board 110 and bottom printed circuit board 120. In these and other embodiments of the present invention, a portion 133 of frame 130 may be omitted such that only portion 131 between top printed circuit board 110 and bottom printed circuit board 120 is present. In these and other embodiments of the present invention, portion 131 of frame 130 may be omitted and only portion 133 outside of edges of top printed circuit board 110 and bottom printed circuit board 120 may be present. An area between frame 130, top printed circuit board 110, and bottom printed circuit board 120, shown here as area 150, may be encapsulated with an epoxy or other appropriate molding or potting compound.

Frame 130 may provide a route paths for signal and power between components on or associated with top printed circuit board 110 and those on or associated with bottom printed circuit board 120. For example, component 112 may be electrically connected to contact 134 on frame 130 via a trace (not shown) on top printed circuit board 110. Contact 134 may be electrically connected contact 132 on frame 130, for example by an interconnect line (not shown) plated on an inside or outside edge of frame 130. Contact 132 may turn electrically connect to component 122 on bottom printed circuit board 120 via a trace (not shown) on bottom printed circuit board 120. Various contacts 136 may also be located on frame 130. Contacts 136 on frame 130 may electrically connect to other contacts on frame 130, top printed circuit board 110, or bottom printed circuit board 120. For example, contact 136 on frame 130 may electrically connect to contact 116 on an edge or other surface of top printed circuit board 110.

Flexible circuit board 140 may have contacts on its surface that electrically connect to contacts 136 on frame 130 through conductive adhesive or solder 142. In various embodiments of the present invention, several contacts on flexible circuit board 140 may connect through sections of conductive adhesive or solder 142 to various contacts 136 on frame 130. This may allow components in the system-in package, such as components 112 and 122, to electrically connect to other circuits outside of this sip module in an electronic device.

In these and other embodiments of the present invention, frame 130 may be formed in various ways and of various materials. For example, frame 130 may be formed of a portion of a printed circuit board, where vias through the printed circuit board provide contacts 132 and 134. In these and other embodiment of the present invention, frame 130 may be made of a laser direct structuring (LDS) material, that is frame 130 may be an LDS frame. An LDS frame may be molded and trace outlines may be defined using a laser. The molding may then be plated, where the plating may adhere to the outlines that were laser defined. Further examples of frames that may be used in various embodiments of the present invention may be found in co-pending U.S. patent application Ser. No. 15/699,946, titled INTERCONNECT FRAMES FOR SIP MODULES, filed Sep. 8, 2017, which is incorporated by reference.

In this example, contacts on a surface of flexible circuit board 140 may be used to electrically connect to contacts on an LDS or other type of frame. In other embodiments of the present invention, other types of connections between flexible circuit board 140 and a system-in-package module may be used. Examples are shown in the following figures.

Figure 2:
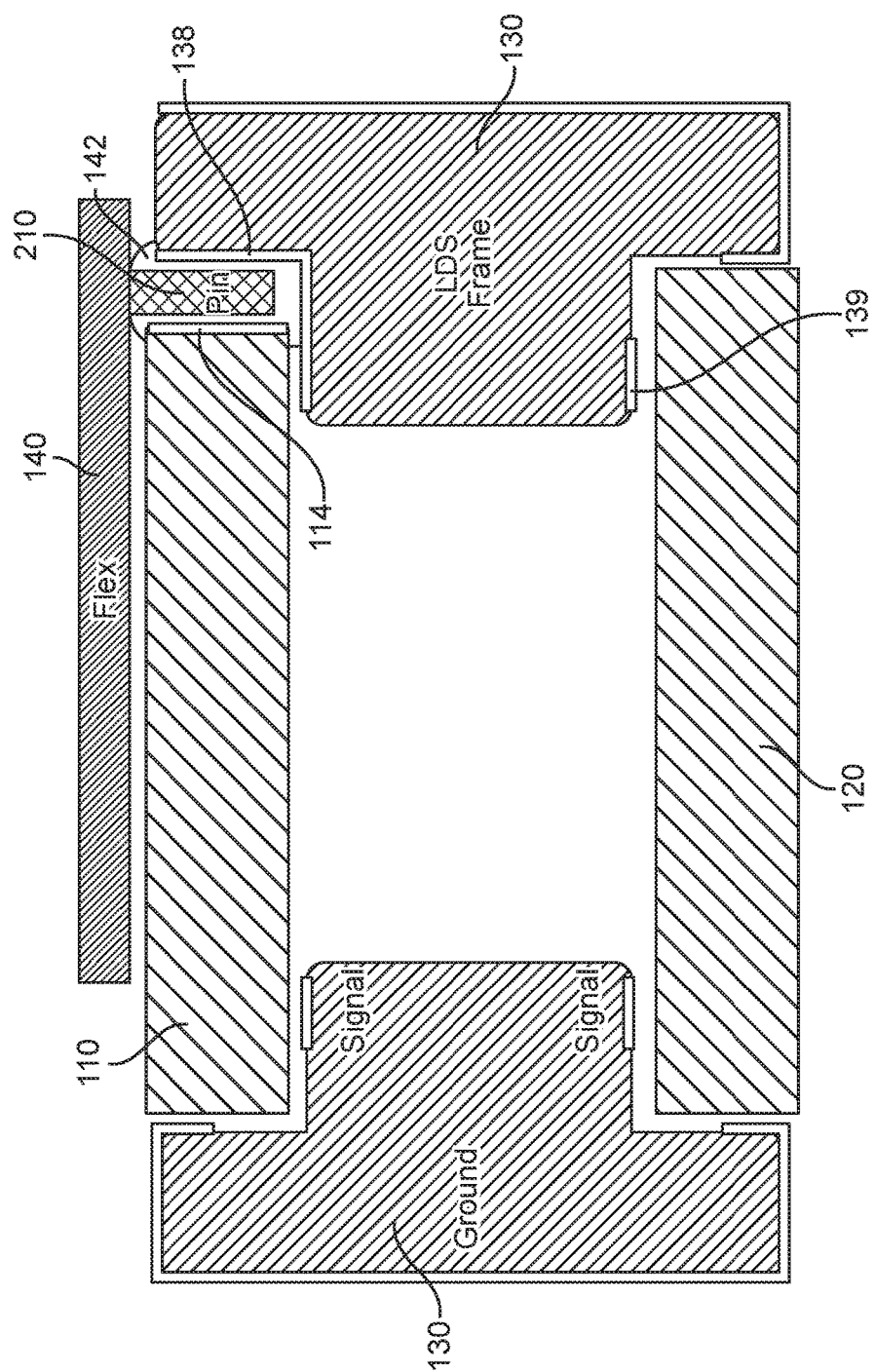
FIG. 2 illustrates another system-in-package module according to an embodiment of the present invention.

FIG. 2 illustrates another system-in-package module according to an embodiment of the present invention. As before, this system-in-package module may include top printed circuit board 110, bottom printed circuit board 120, and frame 130. Flexible circuit board 140 may be attached to pin 210. Pin 210 may electrically connect to traces in flexible circuit board 140. Pin 210 may also connect to contacts 114 on a side or elsewhere on top printed circuit board 110 and contact 138 on LDS frame 130. Pin 210 and contacts 114 and 138 may be electrically connected by conductive epoxy or solder 142. Contact 138 on frame 130 may electrically connect to other contacts, such as contact 139 on frame 130. Contact 138 may further connect to other contacts on frame 130 and to contacts and traces on top printed circuit board 110 and bottom printed circuit board 120. Pin 210 may be formed of a plated LDS material, it may be formed of metal, or may be formed of other conductive material or structure coated with a conductive material. In these and other embodiments several pins 210 may connect to traces on flexible circuit board 140. These several pins 210 may further connect to corresponding contacts 114, 138, or both, through sections of conductive epoxy or solder 142.

Figure 3:
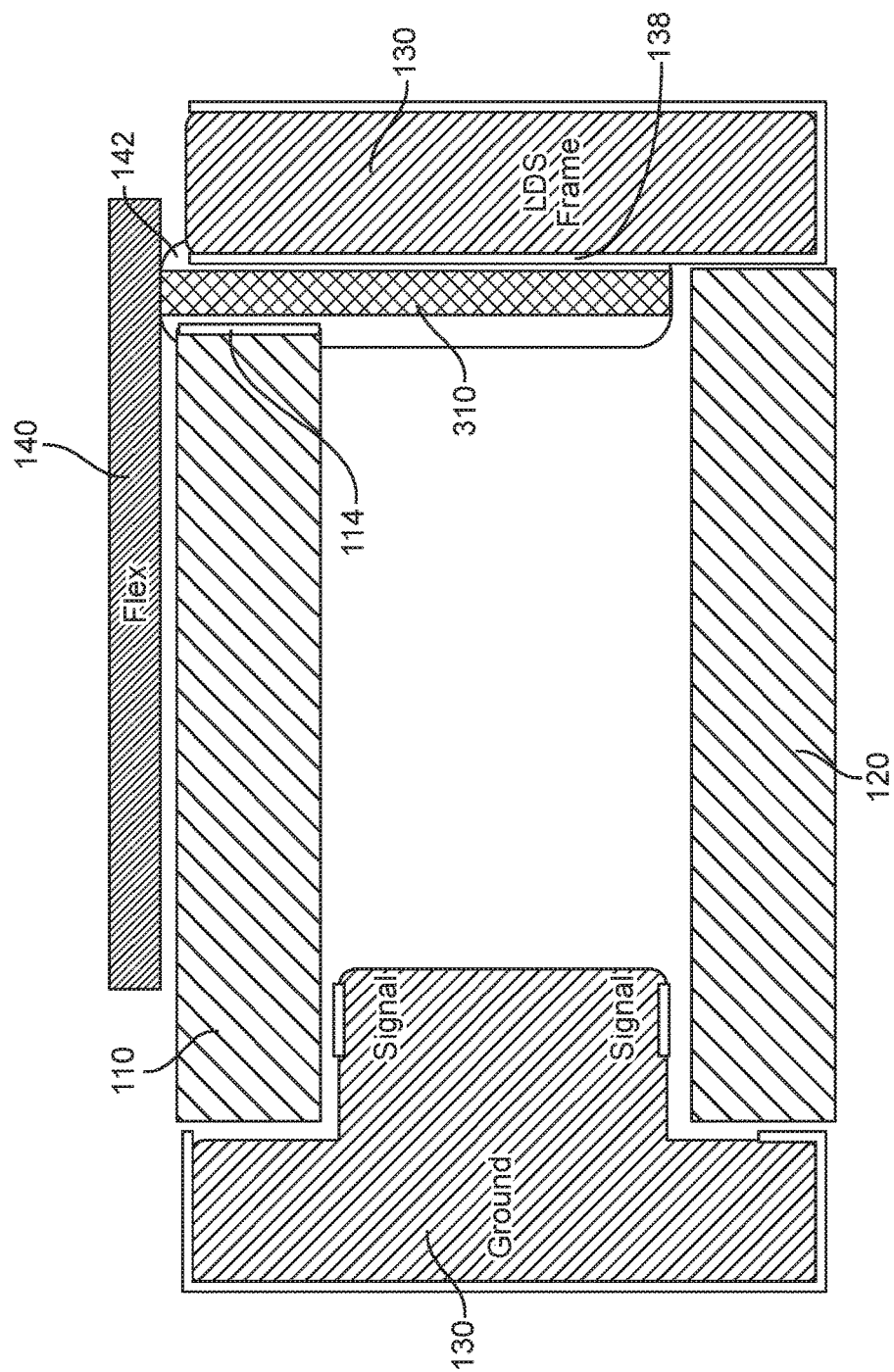
FIG. 3 illustrates another system-in-package module according to an embodiment of the present invention.

FIG. 3 illustrates another system-in-package module according to an embodiment of the present invention. As before, the system-in-package module may include top printed circuit board 110, bottom printed circuit board 120, and frame 130. Flexible circuit board 140 may be attached to pin 310. Pin 310 may electrically connect to traces in flexible circuit board 140. Pin 310 may also connect to contacts 114 on top printed circuit board 110 and contacts 138 on frame 130. Pin 310 and contacts 114 and 138 may be electrically connected by conductive adhesive or solder 142. In these and other embodiments several pins 310 may connect to traces on flexible circuit board 140. These several pins 310 may further connect to corresponding contacts 114, 138, or both, through sections of conductive epoxy or solder 142.

In other embodiments of the present invention, a flexible circuit board may form connections to a system-in-package module and other ways. For example, a system-in-package module may be formed around at least a portion of a flexible circuit board. An example is shown in the following figure.

Figure 4:
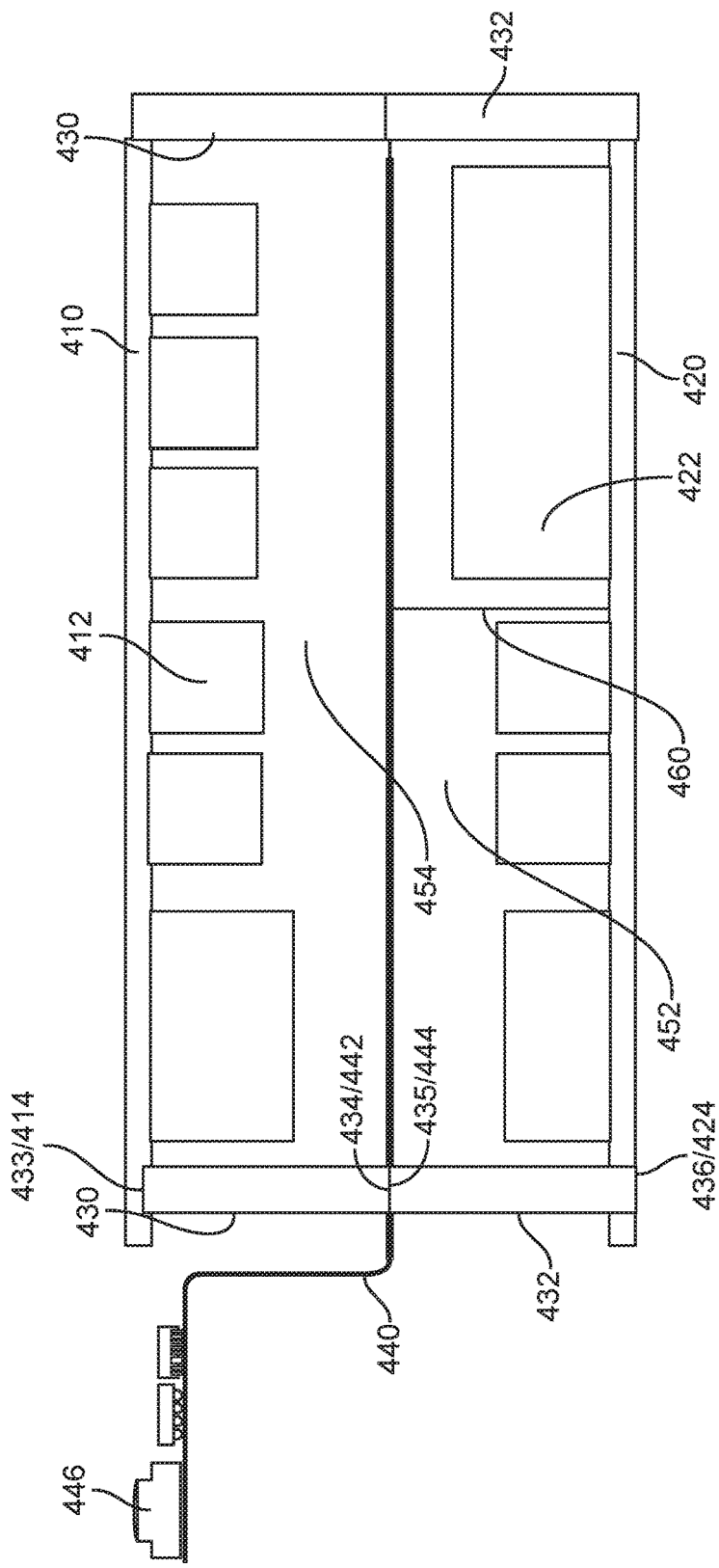
FIG. 4 illustrates a system-in-package module including a portion of a flexible circuit board according to an embodiment of the present invention.

FIG. 4 illustrates a system-in-package module including a portion of a flexible circuit board according to an embodiment of the present invention. This system-in-package module may include top printed circuit board 410 and a bottom printed circuit board 420. Components 412 and 422 may be located on opposing faces of top printed circuit board 410 and bottom printed circuit board 420. Flexible circuit board 440 may be routed through the system-in-package module between top printed circuit board 410 and bottom printed circuit board 420. Flexible circuit board 440 may pass through an opening in a frame, or between portions of a frame, such as frame portions 430 and 432. Flexible circuit board 440 may attach to or be electrically connected to frame portions 430 and 432 via contacts 442 and 444 on flexible circuit board 440 and contacts 434 and 435 on frame portions 430 and 432. Frame portions 430 and 432 may form electrical pathways from contacts 434 to contacts 433, which may connect to contacts 414 on top printed circuit board 410, and from contacts 435 to contacts 436, which may connect to contacts 424 on bottom printed circuit board 420. Flexible circuit board 440 may also connect to top printed circuit board 410 and bottom printed circuit board 420 through vertical interconnect, such as vertical interconnect line 460. Components 446 may be located on flexible circuit board 440, either inside or outside of an area between top printed circuit board 410 and bottom printed circuit board 420. The area between top printed circuit board 410 and bottom printed circuit board 420, specifically areas 452 and 454, may be encapsulated with epoxy or other molding or potting compound. This configuration may allow components 412 and 422 inside of the system-in-package module to electrically communicate with components 446 outside of the system-in-package module and elsewhere in an electronic device.

Figure 5:
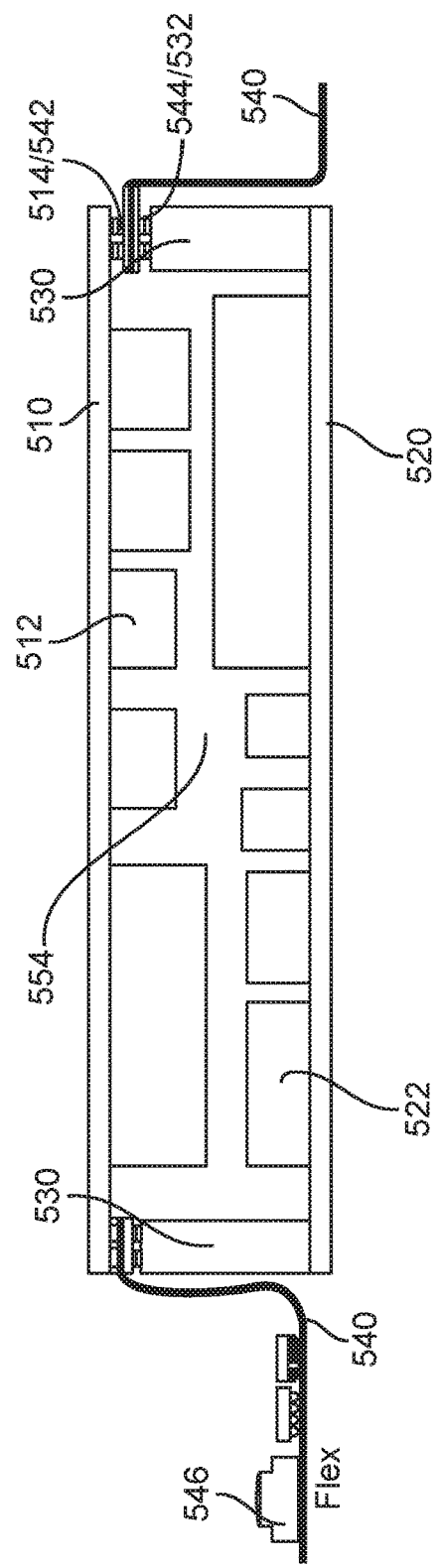
FIG. 5 illustrates another system-in-package module including portions of flexible circuit boards according to an embodiment of the present invention.

FIG. 5 illustrates another system-in-package module including portions of flexible circuit boards according to an embodiment of the present invention. This system-in-package module may include top printed circuit board 510 and a bottom printed circuit board 520. Components 512 and 522 may be located on opposing faces of top printed circuit board 510 and bottom printed circuit board 520. Flexible circuit boards 540 may be attached between frame 530 and top printed circuit board 510. In these and other embodiments of the present invention, one or more flexible circuit boards 540 may be routed through the system-in-package module between top printed circuit board 510 and bottom printed circuit board 520. Each flexible circuit board 540 may attach to or be electrically connected to frame 530 via contacts 544 on flexible circuit board 540 and contacts 532 on frame 530. Each flexible circuit board 540 may attach to or be electrically connected to top printed circuit board 510 via contacts 542 on flexible circuit board 540 and contacts 514 on top printed circuit board 510. Components 546 may be located on a flexible circuit board 540, either inside or outside of an area between top printed circuit board 510 and bottom printed circuit board 520. The area between top printed circuit board 510 and bottom printed circuit board 520, specifically area 554, may be encapsulated with epoxy or other molding or potting compound. This configuration may allow components 512 and 522 inside of the system-in-package module to electrically communicate with components 546 outside of the system-in-package module and elsewhere in an electronic device.

Figure 6:
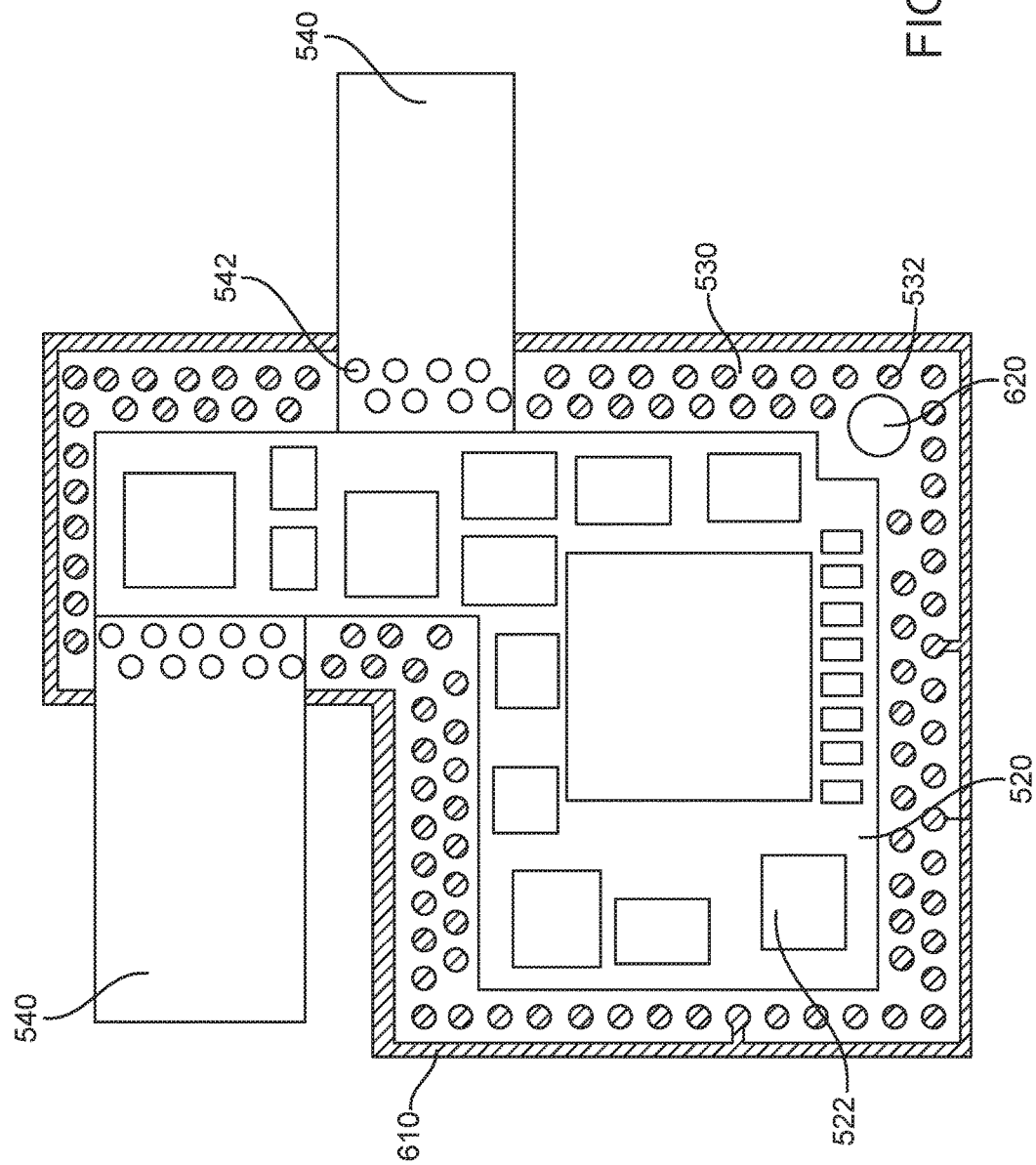
FIG. 6 illustrates at top view of the system-in-package module of FIG. 5.

FIG. 6 illustrates at top view of the system-in-package module of FIG. 5. Components 522 may be placed on bottom printed circuit board 520. Frame 530 may be attached to bottom printed circuit board 520. Frame 530 may include contacts 532. Contacts 544 (shown in FIG. 5) of flexible circuit boards 540 may attach to contacts 532. Contacts 542 may be located on a top side of frame 530. Top printed circuit board 510 (shown in FIG. 5) may have contacts 514 that may connect to contacts 532 and 542. Again, this configuration may provide interconnect paths from components 522 inside the system-in-package module to components 546 (shown in FIG. 5), which may be outside of the system-in-package module. An outside of frame 530 may be shielded by plating or other metallization 610. In these and other embodiments of the present invention, plating or other metallization 610 may be used as an antenna, for shielding, for grounding, or for other reason.

Opening 620 may be an opening through bottom printed circuit board 520, frame 530, and top printed circuit board 510. These openings may provide an alignment feature to align two or more of these structures together. In these and other embodiments of the present invention, other alignment features may be utilized. For example, raised portions on a printed circuit board, such as printed circuit board 510 or 520, may align with recesses in frame 530. The raised portions may be contacts, or they may include contacts. These contacts may electrically connect to contacts in the recesses of frame 530.

These and other contacts may be formed on these LDS frames. LDS material may exhibit a degree of pliability and flexibility. Accordingly, embodiments of the present invention may provide board-to-board connectors that are at least partially formed of an LDS material. An example is shown in the following figure.

Figure 7:
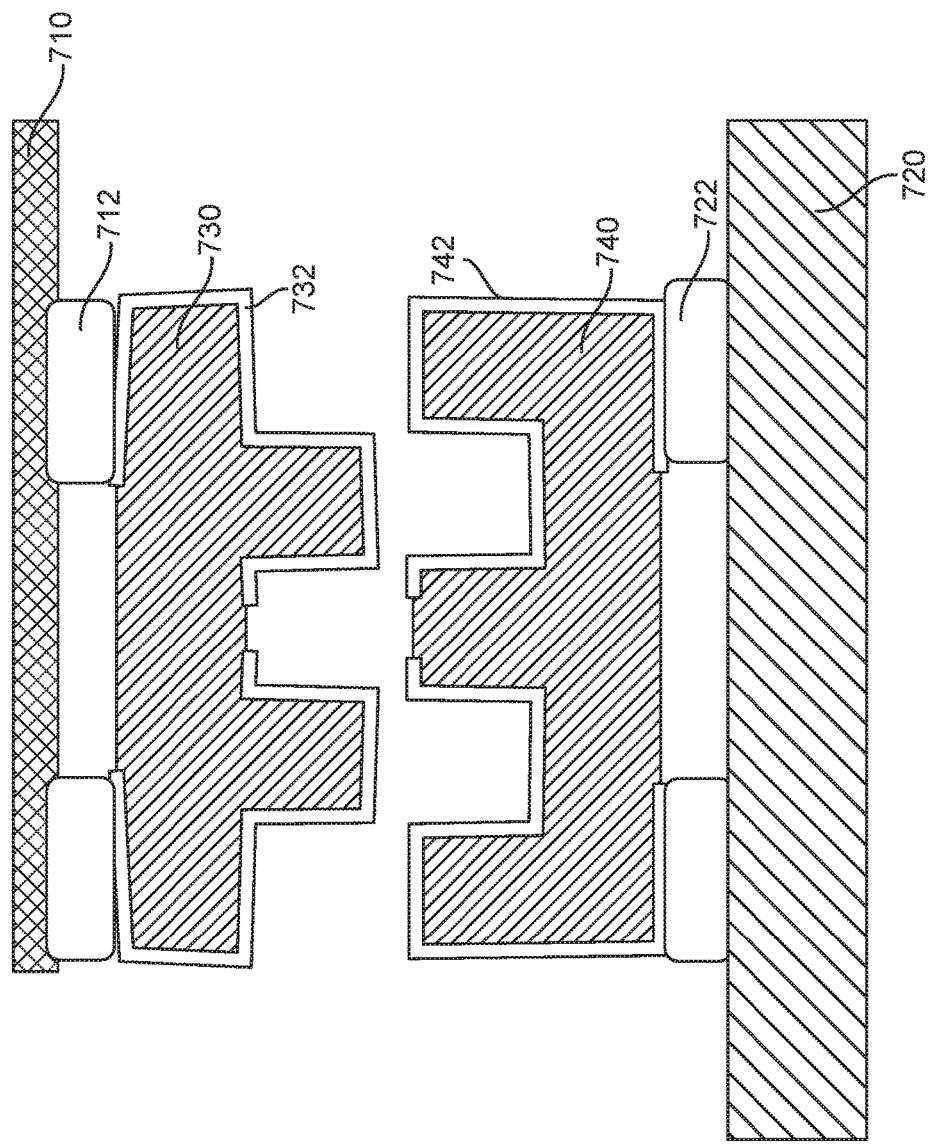
FIG. 7 illustrates a board-to-board connector according to an embodiment of the present invention.

FIG. 7 illustrates a board-to-board connector according to an embodiment of the present invention. In this example, a top circuit board 710 may be in electrical communication with a bottom printed circuit board 720. Top circuit board 710 may be a flexible circuit board, printed circuit board, or other type of board. A plug 730 of a board-to-board connector may include contacts 732 that may electrically connect to contact 742 on board-to-board receptacle 740. Contacts 732 and 742 may be soldered through contacts 712 and 722 respectively to contacts on top circuit board 710 and bottom printed circuit board 720. In this way, LDS plug 730 and receptacle 740 may form a board-to-board connector.

In these and other embodiments of the present invention, either or both LDS sections, the plug 730 and the receptacle 740, may be part of an LDS frame. For example, as plug 730 is inserted into receptacle 740, the result may form a frame or portion of frame 130 in the above examples. While this example, two contacts are shown, in other embodiments of the present invention, more than two contacts may be formed on a board-to-board connector.

Figure 8:
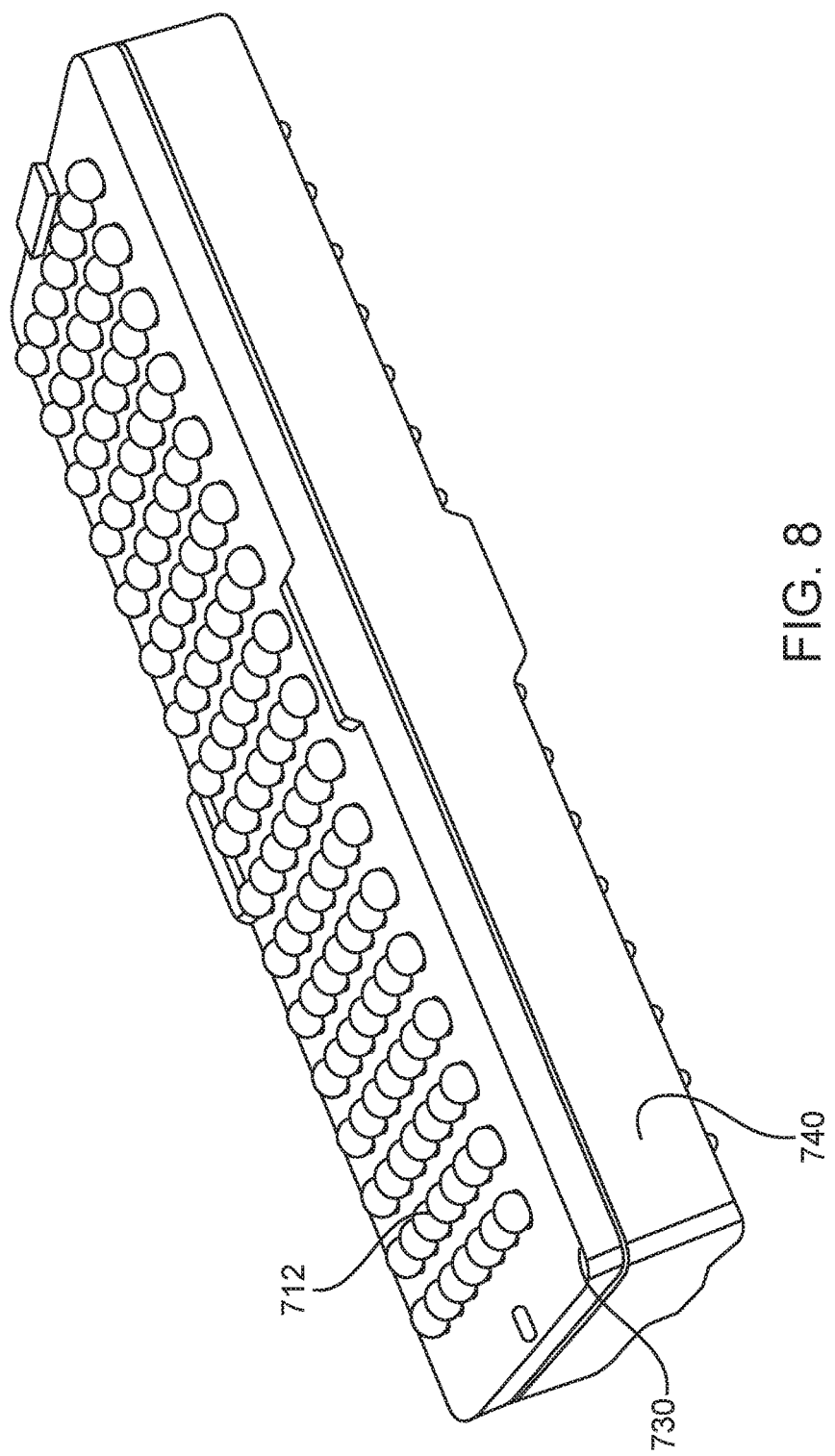
FIG. 8 illustrates another board-to-board connector according to an embodiment of the present invention.

FIG. 8 illustrates another board-to-board connector according to an embodiment of the present invention. In this example, contacts 732 and 742 shown in FIG. 7 may be arranged as an array of contacts. Contacts 712 may be soldered or otherwise attached to a flexible circuit board, a printed circuit board, or other appropriate substrate. Plug 730 may be inserted into receptacle 740. Contacts (not shown) on a bottom side of receptacle 740 may be attached soldered or otherwise attached to a flexible circuit board, a printed circuit board, or other appropriate substrate.

In these and other embodiments of the present invention, other types of contacts may be used as portions of a system-in-package module. Examples are shown in the following figures.

Figure 9:
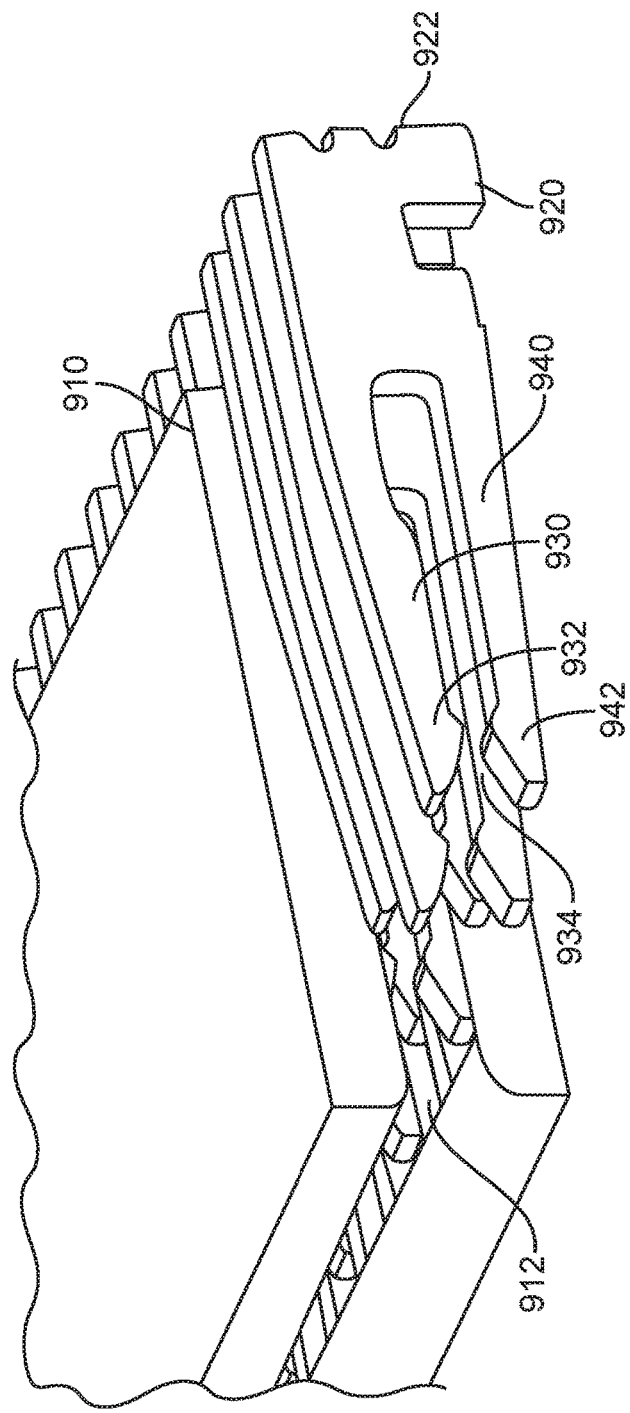
FIG. 9 illustrates a portion of a system-in-package module according to an embodiment of the present invention.

FIG. 9 illustrates a portion of a system-in-package module according to an embodiment of the present invention. In this example, housing 910 may be a portion of a frame, such as frame 130 in the above examples, or other frames consistent with the embodiments of the present invention. An opening 912 may be formed in housing 910. A number of contacts 920 may other be inserted into opening 912, or frame or housing 910 may be formed around contacts 920. Contacts 920 may have arms 930 and 940 that may terminate in contacting portions 932 and 942. Arms 930 and 940 may provide passage 934. Passage 934 may accept an edge of a flexible circuit board, a pin, or other type of conductive structure, which may be attached to a flexible circuit board or other conductor. Contacts 920 may have portions 922 to electrically connect to contacts on a surface of a printed circuit board or other structure in a system-in-package module.

Figure 10:
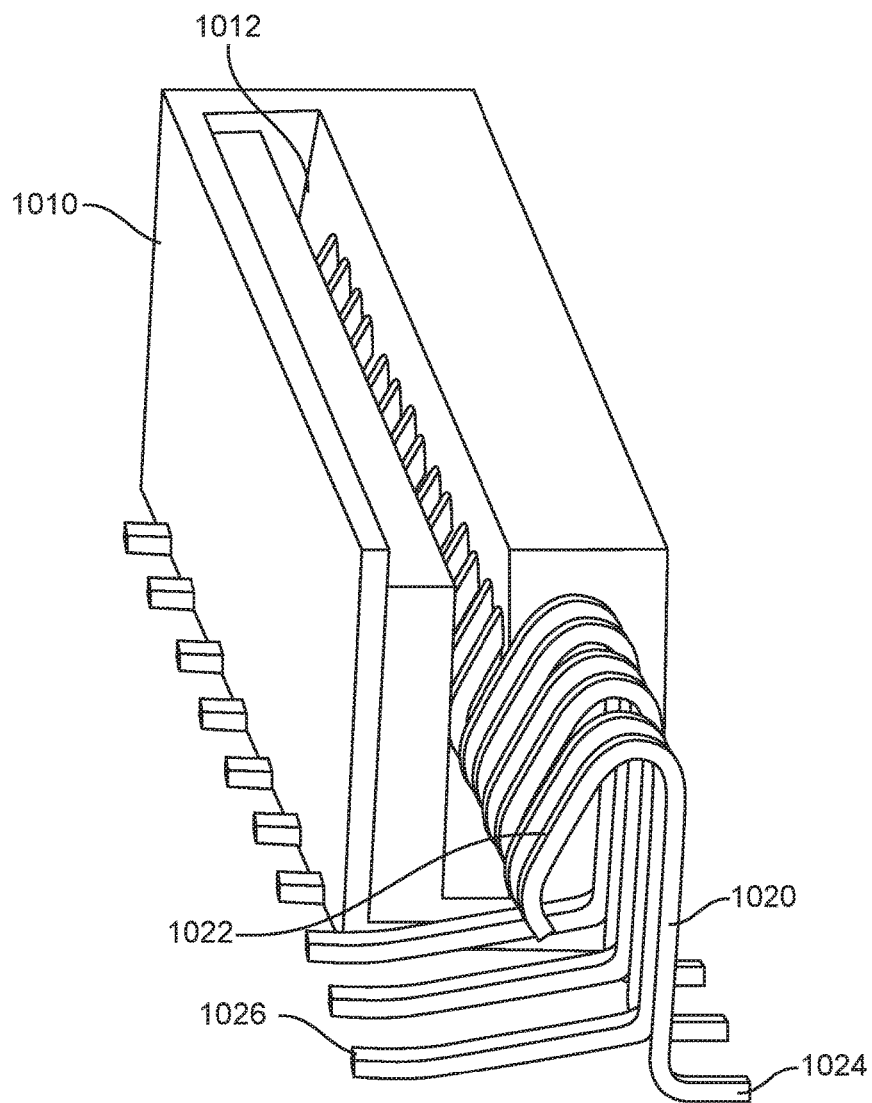
FIG. 10 illustrates another portion of a system-in-package module according to an embodiment of the present invention.

FIG. 10 illustrates another portion of a system-in-package module according to an embodiment of the present invention. In this example, housing 1010 may be a frame or a portion of a frame such as frame 130 in the above examples, or other frames consistent with embodiments of the present invention. Opening 1012 may be formed in housing 1010. Contacts 1020 may be formed or inserted into housing 1010. Contacts 1020 may include contacting portions 1022. Contacting portions 1022 may mate with contacts on a flexible circuit board, pins, or other contacts structures (not shown), which may be connected to a flexible circuit board. Contact tail portions 1024 and 1026 may be soldered to a printed circuit board or other appropriate substrate in the system-in-package module.

In other embodiments of the present invention, one or more contacts may be inserted or formed as part of a frame. In this way, the frame may itself essentially become a connector for a system-in-package module. An example is shown in the following figure.

Figure 11:
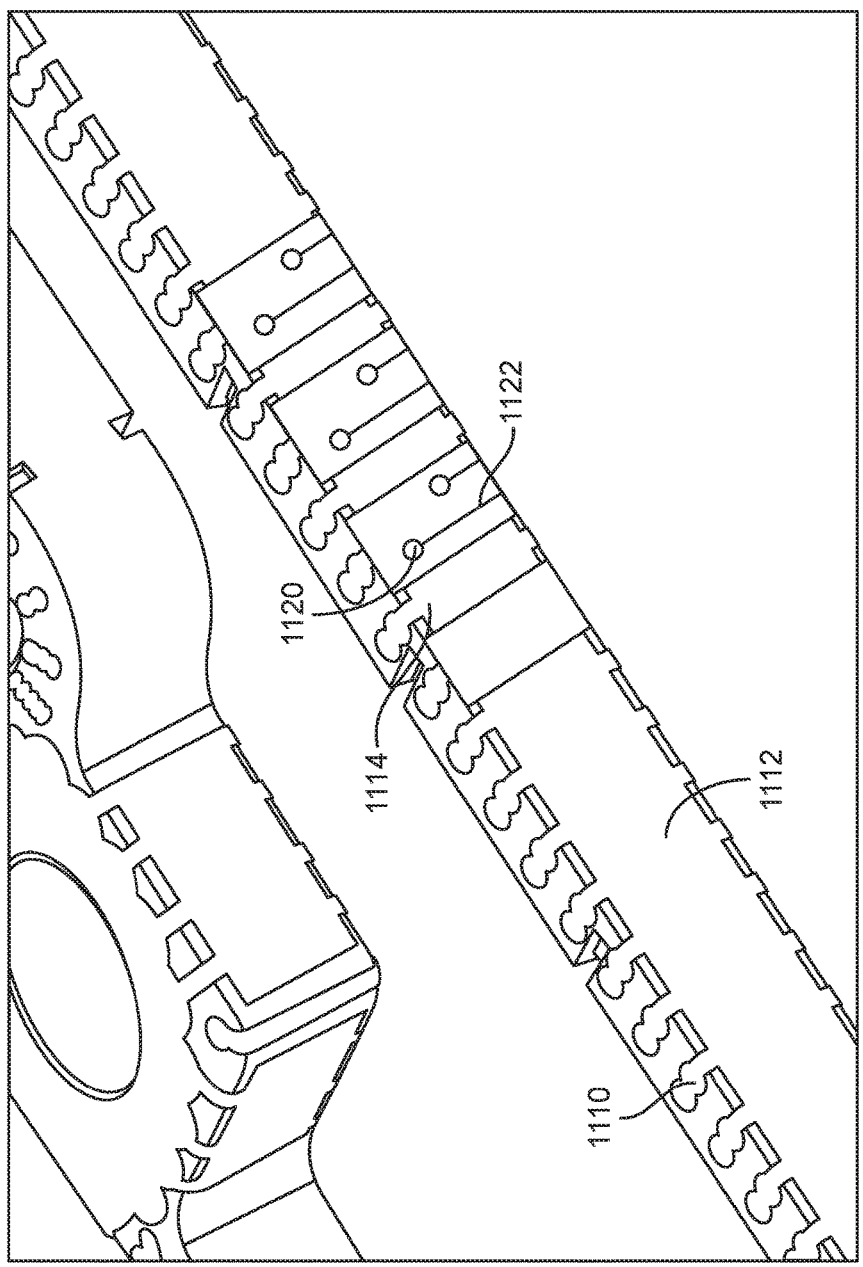
FIG. 11 illustrates a portion of a frame for a system-in-package module according to an embodiment of the present invention.

FIG. 11 illustrates a portion of a frame for a system-in-package module according to an embodiment of the present invention. In this example, frame 1110 may be an LDS or other type of frame. Frame 1110 may include ground regions 1112 on the outside for shielding, as well as conductive paths 1114. Contacts 1120 may be inserted into a side or elsewhere on frame 1110. In these and other embodiments of the present invention, frame 1110 may be formed around contacts 1120. Interconnect traces 1122 may connect contacts 1120 to contacts on either or both top printed circuit board 110 or bottom printed circuit board 120 (as shown in FIGS. 1-3.)

Figure 12:
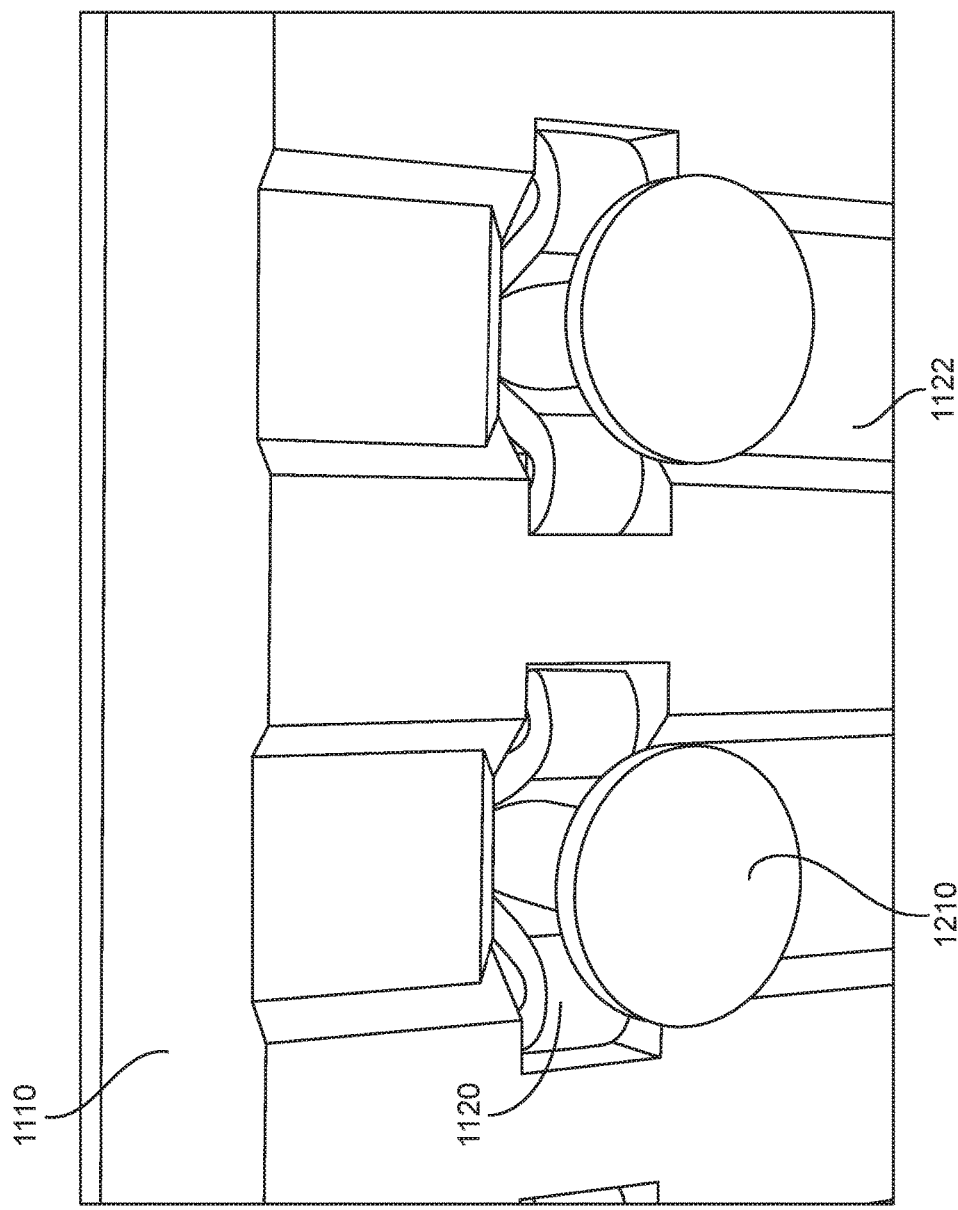
FIG. 12 illustrates a close-up view of contacts in a frame according to an embodiment of the present invention.

FIG. 12 illustrates a close-up view of contacts in a frame according to an embodiment of the present invention. In this example, frame 1110 may include openings for contacts 1120. Interconnect traces 1122 may connect contacts 1120 to contacts on top printed circuit board 110 and bottom printed circuit board 120 (shown in FIGS. 1-3.) Pins 1210 may be inserted into contacts 1120 in frame 1110. Pins 1210 may be pins attached to a connector or other structure, such as a flexible circuit board. Pins 1210 may be used to form electrical connections between a system-in-package module partially housed by frame 1110 other circuits in an electronic device. A more detailed example of contact 1120 is shown in the following figure.

Figure 13:
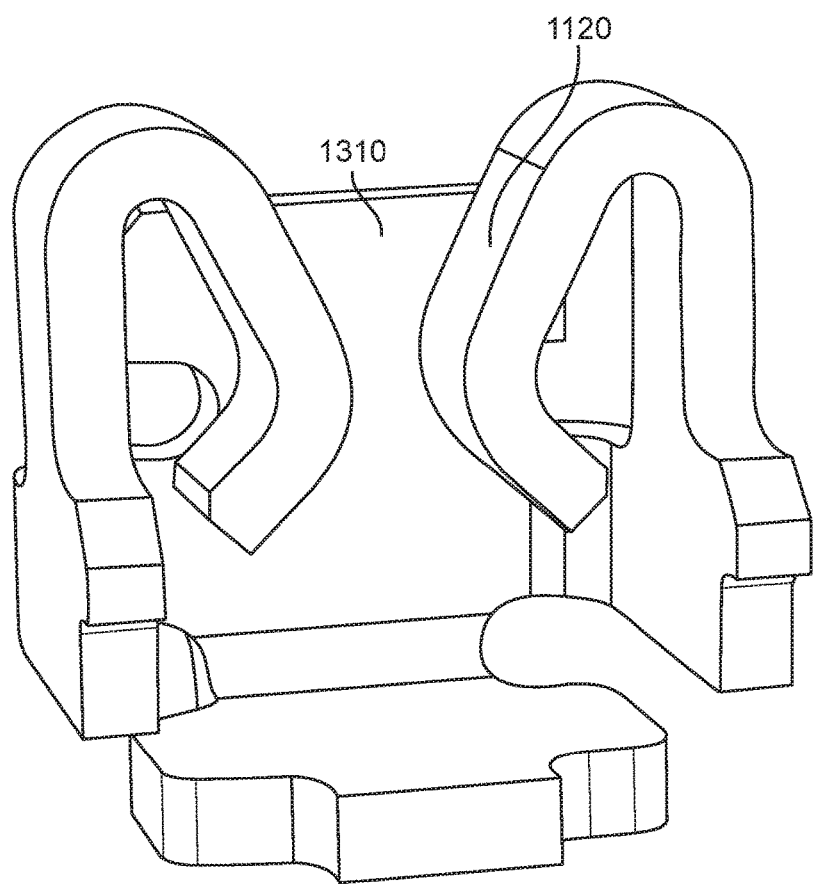
FIG. 13 is a detailed view of a contact that may be part of a connector structure for a system-in-package module according to an embodiment of the present invention.

FIG. 13 is a detailed view of contact that may be part of a connector structure for a system-in-package module according to an embodiment of the present invention. Contact 1120 may include one or more portions 1310 which may electrically connect to conductive traces 1122 formed on LDS frame 1110 (shown in FIG. 11.) Contact 1120 may be made by stamping and forming sheet metal, or by other technique using other conductive material.

In various embodiments of the present invention, an array of contacts may be used as pins 1210 in FIG. 12. Such an array may be used as either interconnect (within a system-in-package module) or as a connector (between a system-in-package module and other components in an electronic device.) An example is shown in the following figure.

Figure 14:
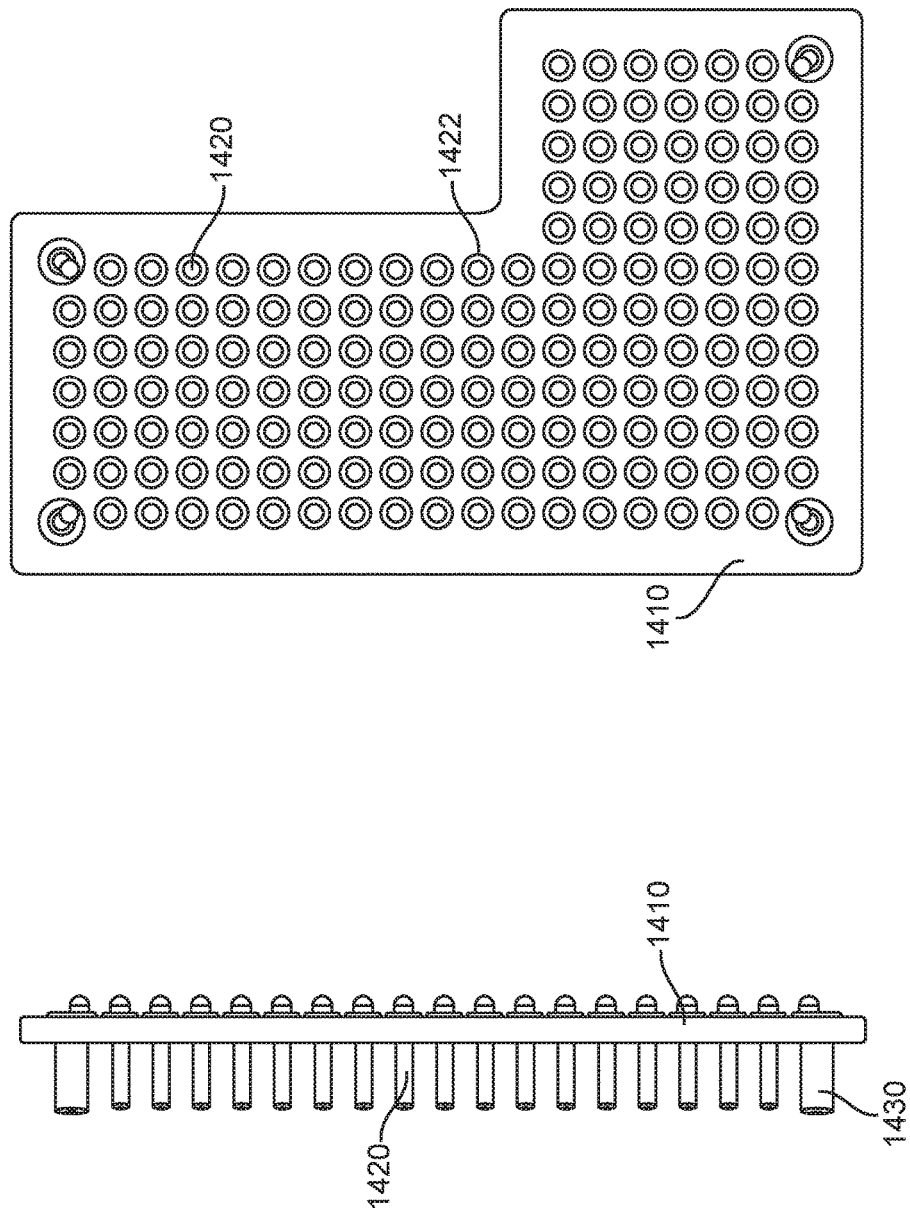
FIG. 14 illustrates a contact array according to an embodiment of the present invention.

FIG. 14 illustrates a contact array according to an embodiment of the present invention. In this example, substrate 1410 may be a flexible circuit board having a number of players for route paths, it may be an LDS frame, or it may be another structure. Pins 1420 may be inserted through sleeves 1422 in substrate 1410. Pins 1420 may be also formed of LDS material, they may be metal pins, or they may be formed of other conductive materials. One or more alignment posts 1430 may be included for alignment and mechanical strength. In various embodiments, this contact array may form connections between multiple system-in-package modules, between various portions of a system-in-package module, between one or more flexible circuit boards, between a system-in-package module and other electronic circuits in a device, or any combination thereof.

It should be noted that while the interconnect structures described above are well-suited to forming system-in-package modules, in other embodiments of the present invention, other types of electronic devices may be formed using these techniques.

In various embodiments of the present invention, contacts, interconnect paths, and other conductive portions of SIP modules may be formed by stamping, metal-injection molding, machining, micro-machining, ink-jet, 3-D, aerosol-jet, or other type of printing, or other manufacturing process. The conductive portions may be formed of stainless steel, steel, copper, copper titanium, phosphor bronze, or other material or combination of materials. They may be plated or coated with nickel, gold, or other material. The nonconductive portions may be formed using injection or other molding, ink-jet, 3-D, aerosol-jet, or other type of printing, machining, or other manufacturing process. The nonconductive portions, such as the various overmolded portions, may be formed of silicon or silicone, rubber, hard rubber, plastic, nylon, liquid-crystal polymers (LCPs), plastic, epoxy, resin, or other nonconductive material or combination of materials. The printed circuit boards used may be formed of FR-4, BT or other material. Printed circuit boards may be replaced by other substrates, such as flexible circuit boards, in many embodiments of the present invention, while flexible circuit boards may be replaced by printed circuit boards or other conduits or conductive structures in these and other embodiments of the present invention.

Embodiments of the present invention may provide SIP modules that may be located in various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
  a system-in-package module comprising:
  a top printed circuit board;
  a first component and a first plurality of contacts on a surface of the top printed circuit board;
  a bottom printed circuit board;
  a second component and a second plurality of contacts on a surface of the bottom printed circuit board, where the surface of the top printed circuit board and the surface of the bottom printed circuit board face each other such that the first component and the second component are between the top printed circuit board and the bottom printed circuit board; and
  a frame attached to the surface of the top printed circuit board and the surface of the bottom printed circuit board, the frame having an outside surface forming an outside surface of the system-in-package module, the frame having a first contact, the frame providing route paths for signals and power from the first component to the second component; and
  a flexible circuit board having a contact electrically connected to the first contact on the frame.

2. The electronic device of claim 1 further comprising a layer of conductive adhesive between the flexible circuit board contact and the first contact on the frame.

3. The electronic device of claim 1 further comprising a layer of solder between the flexible circuit board contact and the first contact on the frame.

4. The electronic device of claim 1 wherein the first contact on the frame is one of a third plurality of contacts on the frame, each electrically connected to a corresponding contact on the flexible circuit board.

5. The electronic device of claim 4 wherein the frame is at least partially located along an edge of bottom printed circuit board.

6. The electronic device of claim 4 wherein a first contact in the first plurality of contacts is electrically connected to the first component through a first trace on the top printed circuit board, wherein a second contact in the second plurality of contacts is electrically connected to the second component through a second trace on the bottom printed circuit board, and wherein the frame includes a first interconnect to connect the first contact to the second contact.

7. The electronic device of claim 4 wherein the frame is a laser direct structuring (LDS) frame, wherein the first contact is a trace on the LDS frame.

8. The electronic device of claim 4 wherein the flexible circuit board contact connects to the first contact on the frame through a pin.

9. The electronic device of claim 8 wherein the pin is located between the top printed circuit board and the frame.

10. The electronic device of claim 9 wherein the pin is one of a plurality of pins between the top printed circuit board and the frame to connect the third plurality of contacts on the frame to corresponding contacts on the flexible circuit board.

11. A system-in-package module comprising:
  a top printed circuit board;
  a first component and a first plurality of contacts on a surface of the top printed circuit board;
  a bottom printed circuit board;
  a second component and a second plurality of contacts on a surface of the bottom printed circuit board, where the surface of the top printed circuit board and the surface of the bottom printed circuit board face each other such that the first component and the second component are between the top printed circuit board and the bottom printed circuit board; and
  a frame attached to the surface of the top printed circuit board and the surface of the bottom printed circuit board, the frame comprising:
  a third plurality of contacts in an outside surface of the frame; and a first trace along the outside surface of the frame to connect one of the third plurality of contacts with one of the first plurality of contacts.

12. The system-in-package module of claim 11 further comprising a second trace along the outside surface of the frame to connect one of the third plurality of contacts with one of the second plurality of contacts.

13. The system-in-package module of claim 11 wherein the frame is an LDS frame and is located along an edge of bottom printed circuit board.

14. The system-in-package module of claim 11 wherein the third plurality of contacts are arranged to accept an edge of a flexible circuit board.

15. The system-in-package module of claim 11 wherein the third plurality of contacts are arranged to accept pins of a connector.

16. The system-in-package module of claim 11 wherein the third plurality of contacts are embedded in the frame.

17. A system-in-package module comprising:
a top printed circuit board;
a first component and a first plurality of contacts on a surface of the top printed circuit board;
a bottom printed circuit board;
a second component and a second plurality of contacts on a surface of the bottom printed circuit board, where the surface of the top printed circuit board and the surface of the bottom printed circuit board face each other such that the first component and the second component are between the top printed circuit board and the bottom printed circuit board;
a flexible circuit board located partially in an area between the top printed circuit board and the bottom printed circuit board, the flexible circuit board partially located beyond the area between the top printed circuit board and the bottom printed circuit board and comprising a third plurality of contacts; and
a frame between the top printed circuit board and the bottom printed circuit board and having a fourth plurality of contacts electrically connected to the second plurality of contacts on the bottom printed circuit board, and further having a fifth plurality of contacts electrically connected to the third plurality of contacts on the flexible circuit board.

18. The system-in-package module of claim 17 wherein the flexible circuit board further comprises a sixth plurality of contacts electrically connected to the first plurality of contacts on the top printed circuit board.

19. The system-in-package module of claim 18 wherein the frame includes signal paths from the fourth plurality of contacts to the fifth plurality of contacts.

20. The system-in-package module of claim 19 wherein the area between the top printed circuit board and the bottom printed circuit board is encapsulated.

* * * * *